United States Patent
Lih et al.

(10) Patent No.: US 7,256,621 B2
(45) Date of Patent: Aug. 14, 2007

(54) KEEPER CIRCUITS HAVING DYNAMIC LEAKAGE COMPENSATION

(75) Inventors: Yolin Lih, San Jose, CA (US); William W. Walker, Los Gatos, CA (US)

(73) Assignee: Fujitsu Limited, Kanagawa (JP)

( * ) Notice: Subject to any disclaimer, the term of this patent is extended or adjusted under 35 U.S.C. 154(b) by 119 days.

(21) Appl. No.: 11/089,956

(22) Filed: Mar. 25, 2005

(65) Prior Publication Data

US 2006/0214695 A1   Sep. 28, 2006

(51) Int. Cl.
*H03K 19/20* (2006.01)
(52) U.S. Cl. .......................... 326/121; 326/98
(58) Field of Classification Search ............ 326/95–98, 326/121, 122; 327/200
See application file for complete search history.

(56) References Cited

U.S. PATENT DOCUMENTS

| | | | |
|---|---|---|---|
| 6,484,267 B1 | 11/2002 | Lee et al. | |
| 6,549,040 B1 | 4/2003 | Alvandpour et al. | |
| 6,621,305 B2 * | 9/2003 | Nakagawa et al. | 326/98 |
| 6,690,604 B2 | 2/2004 | Hsu et al. | |
| 6,759,877 B1 | 7/2004 | Desai et al. | |
| 6,791,365 B2 * | 9/2004 | Bosshart | 326/98 |
| 2004/0051561 A1 | 3/2004 | Gauthier et al. | |
| 2004/0051562 A1 | 3/2004 | Gauthier et al. | |
| 2004/0189337 A1 | 9/2004 | Hsu et al. | |
| 2004/0189347 A1 | 9/2004 | Hsu et al. | |
| 2005/0083082 A1 * | 4/2005 | Olofsson | 326/95 |

OTHER PUBLICATIONS

R.H. Krambeck, C.M. Lee, H Law. High-speed compact circuits with CMOS, IEEE Journal of Solid-State Circuits, Jun. 1982, pp. 614-619, vol. SC-17, No. 3, IEEE, USA.
J.T. Kao, A.P. Chandrakasan, Dual-threshold voltage techniques for low-power digital circuits, IEEE Journal of Solid-State Circuits, Jul. 2000, pp. 1009-1018, vol. 35, No. 7, IEEE, USA.

* cited by examiner

*Primary Examiner*—James H. Cho
(74) *Attorney, Agent, or Firm*—Sheppard, Mullin, Richter & Hampton LLP (57) ABSTRACT

Disclosed are keeper circuits for electronic circuits that selectively maintain the voltage level of an intermediate circuit node at a desired level. In one exemplary embodiment, a keeper transistor either provides current or drains current from the intermediate node to maintain the desired voltage level in response to a signal to do so. The keeper circuit works against a leakage current that either drains current from the node or supplies current to the node. A current-setting transistor is coupled in series with the keeper transistor to set the maximum current through the keeper circuit to a value that is related to this leakage current, preferably tracking the leakage current. With this construction, the current-setting transistor is able to track variations in the leakage current caused by variations in the manufacturing process, and thereby provide dynamic leakage compensation.

37 Claims, 7 Drawing Sheets

KEEPER CIRCUITS HAVING DYNAMIC LEAKAGE COMPENSATION

FIELD OF THE INVENTION

The present invention relates to keeper circuits that may be used in electronic circuits to maintain selected voltage levels, and more particularly to keeper circuits that may be used in digital dynamic logic circuits to maintain selected voltage levels corresponding to selected digital logic values.

BACKGROUND OF THE INVENTION

Electronic digital gates can be generally divided into two classes: static gates and dynamic gates. In a static digital gate, the transistors are configured so as to maintain the state of the gate's output until one or more of the inputs to the gate change. CMOS static gates generally have slow pull-up times at their outputs due to the lower conductance of the PMOS devices. In a typical dynamic digital gate (FIG. 1), an intermediate node is pre-charged by a pull-up PMOS transistor during a first phase of a clock signal, and then selectively discharged by a pull-down logic circuit during a second subsequent phase of the clock signal. Whether or not the intermediate node is discharged will depend upon the logic states of the inputs to the pull-down logic circuit. The logic circuit is typically disabled during the first phase of the clock by an NMOS footer transistor, although the footer is unnecessary if the logic inputs are held in a state that guarantees no pull-down leg will be conducting during the pre-charge phase. The voltage state of the intermediate node is typically provided as an input to a buffer circuit or a simple (fast) static gate. The dynamic gate reduces the impact of the low conductance of the PMOS transistor by having the pull-up PMOS transistor conduct during the time the dynamic digital gate is not evaluating the inputs to the logic circuit. The pre-charge time is generally much longer than the switching time of the gate, thus accommodating the low conductance of the pull-up PMOS transistor. Thus, for the same amount of power consumption, CMOS dynamic digital gates are generally faster than CMOS static digital gates, and are preferred for use in high-speed microprocessors.

However, microprocessors are complex and often require scanning to debug and verify the functionality of the microprocessor's circuits. In a typical scanning process, the operation of the microprocessor is stopped at selected points in time by freezing the main clock signal, and the logic states of selected nodes are probed or read out for analysis by various means known to the art. During the time the main clock is stopped, the intermediate nodes that have not been previously discharged by their associated pull-down logic circuits begin slowly to lose their charged states due to leakage currents flowing in the turned-off transistors of the pull-down logic circuits, and there is a risk that incorrect data states will be read. Also, there is often a need to restart the microprocessor after the scanning process is done, and there is a risk that the microprocessor will be restarted from an erroneous state.

To address these risks, a keeper circuit is typically added to each key dynamic gate and to each key register bit. The keeper circuit senses the data state of the intermediate node, and provides a small charging current to the node when the data state is in a charged state. A keeper circuit typically comprises an inverter gate having an input coupled to the intermediate node, and an output coupled to the gate of a PMOS charging transistor. The PMOS charging transistor is configured to provide a small charge current when the output of the inverter is at a low voltage (corresponding to when the intermediate node is high). The charging current is sufficiently small that it can be overpowered by the pull-down logic circuit that is coupled to the intermediate node. The keeper circuit slows down the operation of the dynamic gate by a small amount by providing current to the intermediate node at the time the pull-down logic circuit is attempting to discharge the node. The keeper circuit also slightly increases the power dissipation of the gate. These problems are relatively minor for CMOS technologies having minimum gate lengths of 0.35 µm and above.

SUMMARY OF THE INVENTION

As part of making their invention, the inventors have found that the keeper circuit encounters a new and significant problem for CMOS technologies having minimum transistor gate lengths of 0.1 µm and below. Specifically, it was discovered that conventional keeper circuits effectively limit the number of pull-down legs in the pull-down logic circuit to approximately eight (8), which significantly limits the circuit design of digital dynamic circuits, particularly register files and multi-port SRAMs. As explained in greater detail below, variations in the manufacturing process create variations in the threshold voltages and transconductances of the PMOS and NMOS transistors. This causes variations in the leakage currents and sinking currents of the NMOS pull-down transistors, and variations in the supply currents of the PMOS keeper transistors. In one instance, a PMOS keeper transistor having low supply current could be paired with a set of NMOS pull-down transistors having high leakage currents, while in another instance, a PMOS keeper transistor having high supply current could be paired with a set of NMOS pull-down transistors having low sinking currents (which correlate with low leakage currents). In the first instance, the size of the keeper transistor in the conventional keeper circuit must be made large enough so as to provide enough current in the case where the NMOS pull-down transistors have high leakage currents (so as to maintain the intermediate node at logic "1" when all the pull-down transistors are off). On the other hand, in the second instance, the size of the conventional keeper transistor must be made small enough to prevent it from supplying too much current in the case where the NMOS pull-down transistors have low sinking currents (so as not to overpower a single pull-down leg that has been activated by the input signals to discharge the intermediate node). These two requirements are contradictory, and impose an upper limit on the number of pull-down legs in the logic circuit, as follows: if the number of legs exceeds the upper limit, then a keeper transistor that is large enough to compensate for the leakage current will supply too much current for a single pull-down leg to overcome during logic evaluation, or, practically speaking, even if the logic evaluation is successful, the speed will be slower than a static CMOS implementation of the same logic function. In advanced CMOS processes with channel lengths below 0.1 µm and transistor threshold voltages below 200 mV, the number of pull-down legs is found to be limited to 8-16 in order to satisfy the constraints imposed by both instances. In future technologies with additional threshold voltage scaling, the maximum number of pull-down legs will be limited to less than 8.

The present invention eliminates the above limitation by coupling a current-setting transistor in series with the keeper transistor, with the current-setting transistor setting the maximum current flow through its conduction terminals to a level that is related to the leakage current level of the transistors in the pull-down logic circuit. The keeper transistor may thereby be designed to have a higher conductance than that of the current-setting transistor since its maximum current is set by the current-setting transistor. When the keeper transistor is enabled, the total current flowing through it and the current-setting transistor can be made to substantially track the leakage current, despite process variations, and even temperature variations. Either the keeper transistor or the current-setting transistor may be coupled to the intermediate node. In a set of preferred embodiments, the maximum current flow through the current-setting transistor is limited to an estimate of the sum of the maximum leakage currents through the legs of the NMOS logic circuit plus a safety margin, such as 10% to 1000% of the estimated sum of the leakage currents. In these preferred embodiments, the estimate of the sum of the maximum leakage currents is preferably generated from a sensing network that comprises at least one NMOS transistor located near the NMOS pull-down transistors of the logic circuit. As explained in greater detail below, the sensing network may be configured in a number of ways. In these preferred embodiments, the leakage current of the sensing network may be measured and scaled by two PMOS transistors configured in a current-mirror topology, with the controlled mirror transistor being used as the current-setting transistor. Thus, in this manner, the maximum current through the keeper transistor is set to a value that is related to the leakage current of the adjacent NMOS pull-down transistors, and is automatically adjusted to account for variations in the leakage current caused by manufacturing variations. Furthermore, the current-mirror topology minimizes the effects that variations in the PMOS-transistor characteristics have on the maximum current value of the current-setting transistor.

While the majority of dynamic digital logic gates in the art operate by pre-charging the intermediate node and thereafter selectively discharging the node with NMOS pull-down transistors, it may be appreciated that the complementary approach may be useful in some applications. In the complementary approach, the intermediate node is discharged during the first phase of a clock signal and thereafter selectively charged by a pull-up logic circuit comprised of PMOS pull-up transistors. The complementary approach can also be in need of a keeper circuit, and the present invention is applicable to dynamic digital gates using the complementary approach. In that case, the sensing network could comprise one or more PMOS transistors, and the leakage current of the sensing network could be measured and scaled by two NMOS transistors configured in a current-mirror topology, with the controlling mirror transistor coupled to the PMOS sensing network and the controlled mirror transistor being used as the current-setting transistor.

In either the first or second (complementary) approaches, the keeper transistor may have any form. Nonetheless, it is generally convenient to use a PMOS keeper transistor in the first approach (where an NMOS pull-down logic circuit is used in the gate), and an NMOS keeper transistor in the second approach (where a PMOS pull-up logic circuit is used in the gate). In each case, the gate of the keeper circuit may be driven by the output of an inverter that has its input coupled to the intermediate node.

In addition, while the preferred embodiments have been illustrated by CMOS technology, it may be appreciated that embodiments of the present invention may be implemented with complementary bipolar transistors. In each of the examples described above, the NMOS transistors may be replaced by NPN transistors, and the PMOS transistors may be replaced by PNP transistors. In each case, the collector terminal of the bipolar transistor takes the place of the drain terminal of the MOS transistor, the emitter terminal of the bipolar transistor takes the place of the source terminal of the MOS transistor, and the base terminal of the bipolar transistor takes the place of the gate terminal of the MOS transistor. It is generally recognized that NMOS and NPN transistors are transistors of a first conductivity type (where the majority carriers are electrons), and that PMOS and PNP transistors are transistors of a second conductivity type (wherein the majority carriers are holes), with the first and second conductivity types being opposites. Collector, emitter, drain, and source terminals are generally known as conduction terminals since the principal current of the transistor flows through these terminals. The base and gate terminals are generally known as the modulation terminals since an electrical signal applied to these terminals (current in the case of the base, voltage in the case of the gate) modulates the amount of the principal current.

Furthermore, while the present invention finds its primary application in the arena of digital circuits, it may be appreciated that the present invention may be useful in some analog circuits, such as some types of sample-and-hold circuits (particularly sample-and-hold circuits that are operated in a multiplexed manner to digitize a high-frequency circuit). In the latter application, the keeper transistor would be operated in opposite phase to the sampling transistor, and the current-setting transistor could provide a current related to the junction leakage current of the sampling transistor.

In view of the various possible implementations and applications of the present invention, broad embodiments of the present invention encompass keeper circuits for use in circuits powered by a voltage provided between a first supply line and a second supply line, with each keeper circuit configured to selectively maintain an intermediate node of the circuit at a first voltage level in opposition to a leakage current being conducted between the intermediate node and at least one of the supply lines. A first exemplary broad embodiment of a keeper circuit comprises a keeper transistor having a first conduction terminal, a second conduction terminal, and a modulation terminal, the modulation terminal receiving a signal indicating whether the keeper transistor is to maintain the intermediate node at the first voltage level. (When applied to dynamic digital gates, this signal may be related to the voltage state of the intermediate node.) The first exemplary broad embodiment further comprises a first transistor of a first conductivity type having a first conduction terminal, a second conduction terminal, and a modulation terminal, with one of the conduction terminals of the first transistor being coupled to a conduction terminal of the keeper transistor to provide a series circuit of the transistors. The series circuit is coupled between the intermediate node and the first supply line, with the first transistor setting the flow of current through the keeper transistor. The first exemplary broad embodiment further comprises a second transistor of the first conductivity type having a first conduction terminal, a second conduction terminal, and a modulation terminal. The second transistor is coupled to the first transistor in a current-mirror relationship such that the maximum amount of current conducted by the first transistor through its conduction terminals is related to the current conducted by the second transistor through its conduction terminals. The first exemplary broad embodiment further comprises a sensing network having a first conduction terminal coupled to the first conduction terminal of the second transistor, and a second conduction terminal coupled to a source of potential, which may be the second supply line. The sensing network comprises at least one transistor of a second conductivity type opposite to the first conductivity type and generates a current at its first conduction terminal that is in relation to the leakage current being conducted between the intermediate node and at least one of the supply lines. The sensing network is thus capable of sensing a leakage current representative of the leakage current being conducted between the intermediate node and a supply line, and the configuration of the first and second transistors is capable of measuring this current, and of setting the maximum current through the first transistor to a scaled representation of the leakage current of the third transistor. With this construction, the present invention is able to more accurately estimate the leakage currents of the pull-down transistors (or pull-up transistors) for any process variation, thereby enabling the keeper circuit to minimize its impact on the gate propagation delay while reliably maintaining the state of the intermediate node when needed. Furthermore, this may be accomplished without having to limit the number of pull-down legs (or pull-up legs) in the logic circuit.

Accordingly, it is an object of the present invention to enable keeper circuits to be used in dynamic digital gates implemented with transistor gate lengths of less than 0.1 μm to enable an increase in the maximum number of pull-down legs (or pull-up legs) in the logic circuits of the gates.

It is a further object of the present invention to provide keeper circuits that have uniform and predictable impacts on the evaluation times of digital dynamic gates despite a wide range of variations in transistor characteristics due to manufacturing variations.

It is a further object of the present invention to enable large memory devices to be built without impact on access speed by enabling addressing gates to be constructed with more than sixteen pull-down legs.

It is another object of the present invention to provide keeper circuits for analog circuit applications that have uniform and predictable impacts on the analog circuits despite a wide range of variations in transistor characteristics due to manufacturing variations.

These and other objects of the present invention will become apparent to those skilled in the art from the following detailed description of the invention, the accompanying drawings, and the appended claims.

DETAILED DESCRIPTION OF THE INVENTION

Figure 1:
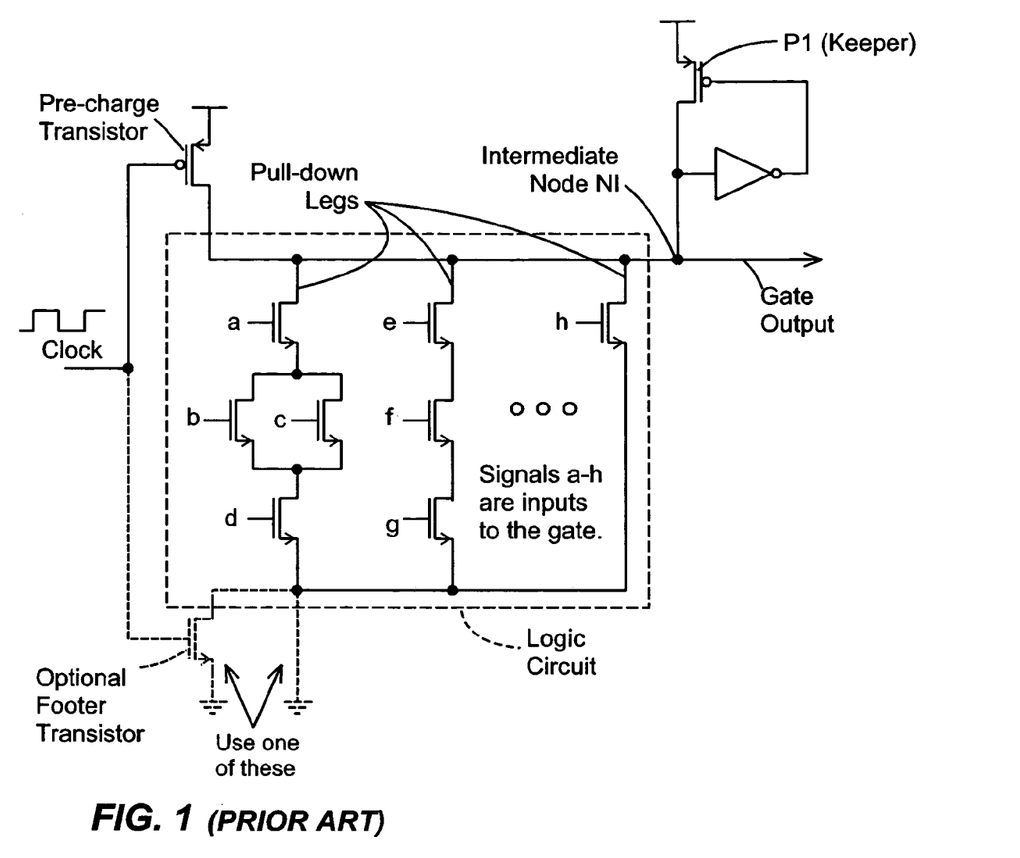
FIG. 1 shows a conventional keeper circuit according to the prior art.

Dynamic Domino CMOS circuits have been widely used because they offer faster circuit operation compared to static circuits. A conventional dynamic gate, as shown in FIG. 1, employs a keeper transistor P1 that is designed to compensate for leakage current in the NMOS transistors of the pull-down logic circuit. This keeper transistor is needed to prevent the intermediate node NI from being inadvertently discharged to ground by the leakage current in the event that all inputs a-h remain at "0" during evaluation of the function. The on-conductance of keeper transistor P1 is typically a small fraction of the on-conductance of any of the legs in the logic circuit, otherwise the logic delay will be impaired roughly proportionate to the ratio of the on-conductances. (The pre-charge transistor and the optional footer switch are part of the dynamic gate and do not form part of the present invention. If the footer switch is not used, a conductive short to the second supply line is used.)

As indicated above, as part of making their invention, the inventors discovered that conventional keeper circuits effectively limit the number of pull-down legs in the pull-down logic circuit to approximately sixteen (16) or less for transistors with gate lengths of 0.1 μm or less, which is a significant limitation on the circuit design of digital dynamic circuits, particularly register files and multi-port SRAMs. As a practical matter, the number of pull-down legs is limited to approximately eight (8) or less in order to maintain reasonable propagation delays. The reason for this limitation is complex. In any CMOS manufacturing process, there will be variations in the device characteristics of the PMOS transistors and NMOS transistors. As a result, there will be some PMOS transistors that conduct more current than the target design (so-called "fast" PMOS transistors), and some that conduct less (so-called "slow" PMOS transistors). Likewise, there will be some NMOS transistors that conduct more current than the target design ("fast" NMOS transistors), and some that conduct less ("slow" NMOS transistors). The manufacturing process will result in nine general combinations of PMOS and NMOS transistors: target PMOS with target NMOS, target PMOS with fast NMOS, target PMOS with slow NMOS, slow PMOS with target NMOS, slow PMOS with slow NMOS, etc. For the overall circuit to work, each subsystem of the circuit must work under all nine combinations, which generally means that each gate of a subsystem must work under all nine combinations. Of these, the combination of slow PMOS with slow NMOS usually poses the greatest challenge to the circuit designer since it results in slow switching performance.

However, for keeper circuits designed for transistor gate lengths of 0.1 μm or less, the inventors have found that the following two combinations pose the greatest challenge: slow PMOS with fast NMOS, and fast PMOS with slow NMOS. On one hand, the maximum current of the PMOS keeper transistor needs to be high enough to overcome the total leakage currents of all the pull-down legs of the pull-down logic circuit for the combination of fast NMOS and slow PMOS transistors, where the leakage currents of the NMOS transistors is high. On the other hand, the maximum current of the PMOS keeper transistor needs to be low enough not to over-power one active pull-down leg for the combination of slow NMOS and fast PMOS transistors. The inventors have found that, for gate lengths of 0.1 μm or less, the differences between the supply currents of fast and slow PMOS transistors increases at a greater rate than the decrease in gate length, and the differences between the leakage currents of fast and slow NMOS transistors increases at a greater rate than the decrease in gate length. These differences become so great that the above two conditions on the size of the PMOS keeper transistor cannot be achieved for more than eight (8) pull-down legs when transistors having standard threshold voltages are used, and cannot be achieved for more than sixteen pull-down legs when transistors having high threshold voltages are used. This design limitation is eliminated by the present invention.

Figure 2:
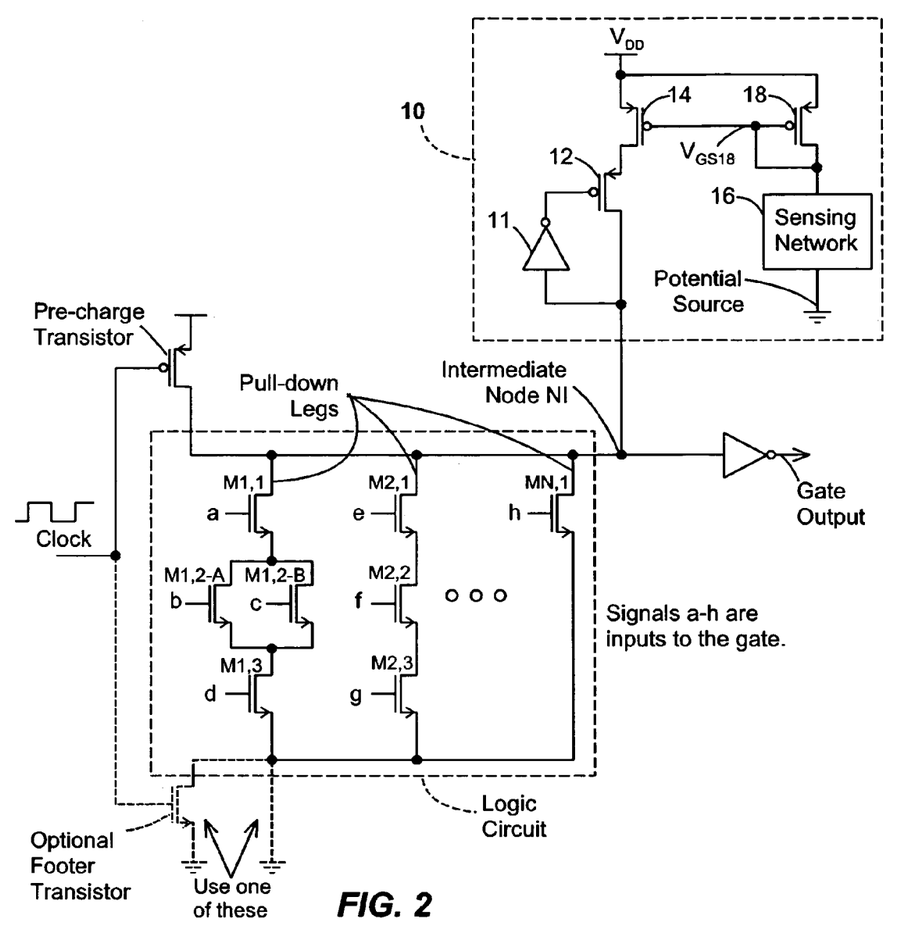
FIG. 2 illustrates a first exemplary class of keeper circuits according to the present invention as applied to a representative digital dynamic gate.

A first exemplary embodiment of a keeper circuit according to the present invention is shown at 10 in FIG. 2. Keeper circuit 10 comprises a keeper transistor 12 driven by an inverter 11, a current-setting transistor 14, a sensing network 16, and a controlling mirror transistor 18. Keeper circuit 10 is illustrated with PMOS transistors for each of transistors 12, 14, and 18, and one or more NMOS transistors are used in sensing network 16, as explained in greater detail below. The symbol for the PMOS transistor is distinguished by the inversion bubble placed at the gate of the device, and by the arrow pointing from the source terminal to the gate terminal. The symbol for the NMOS transistor is distinguished by the arrow pointing from the gate terminal to the source terminal. As is known in the art, the source and drain terminals of a MOSFET device are determined by the polarity of the potential difference between the terminals, and can be reversed during operation by reversing the polarity. For an NMOS transistor, the drain terminal has a higher potential than the source terminal; for a PMOS transistor, the drain terminal has a lower potential than the source terminal. For most transistors in most digital circuits, the source and drain terminals remain the same throughout the operation of the circuit, and rarely change due to a reversal in the polarity between the conduction terminals. That is the case for keeper circuit 10.

Turning to the details of keeper circuit 10, current-setting transistor 14 and keeper transistor 12 are coupled in a series circuit (e.g., drain terminal of transistor 14 is coupled to source terminal of transistor 12), and the series circuit is coupled between supply line VDD and the intermediate node NI. The gate of keeper transistor 12 is driven by the output of inverter 11, and the input of inverter 11 is coupled to intermediate node NI. The use of inverter 11 in this manner is conventional, and does not form part of the present invention. (In fact, for some implementations of the present invention for analog circuits, inverter 11 is not needed.) Sensing network 16 comprises one or more transistors that are the same type as the pull-down transistors in the gate's logic circuit (NMOS in this case), and is located in relative close proximity to the pull-down transistors. Sensing network 16 need only be located on the same die as the gate's logic circuit, which is generally within 3 centimeters of the logic circuit. In some cases, it may be preferably to have network 16 and the logic circuit located within 2 centimeters of one another, and sometimes more preferable to have them located within one centimeter. If the die has multiple wells, then the sensing circuit 16 and the logic circuit may be in the same substrate well (e.g., P-well or N-well, depending upon transistor types). As explained in greater detail below, the one or more transistors of sensing network 16 are configured to generate a leakage current that is in relation to the expected maximum leakage current of the logic circuit. The relation may be of substantial equality, or the leakage current of sensing network 16 may substantially be a scaled replica of the expected maximum leakage current of the logic circuit. In this manner, the sensing network senses the maximum leakage current of the logic circuit.

The leakage current generated by sensing network 16 is measured by controlling mirror transistor 18, which has its drain and gate terminals coupled to the top conduction terminal of sensing network 16 to receive the leakage current of network 16. Transistors 14 and 18 are configured in a current mirror topology whereby the current flowing through controlling mirror transistor 18 is replicated and scaled by a selectable amount in transistor 14. This is done regardless of process variations in the characteristics of the transistors (i.e., regardless of whether they are fast or slow PMOS transistors). In this configuration, current-setting transistor 14 also acts as a controlled mirror transistor. During operation, the gate-to-source voltage $V_{GS18}$ of transistor 18 adjusts itself so that the current flow through the device matches the leakage current flowing through sensing network 16. This gate-to-source voltage is replicated onto current-setting transistor 14 by coupling the gate terminal of transistor 18 to the gate terminal of transistor 14, by coupling the source terminal of transistor 18 to the source terminal of transistor 14, and by making the construction features of transistors 14 and 18 substantially the same, with the possible exception of the gate widths. With this configuration, the maximum current through current-setting transistor 14 is substantially set to the level of current flowing through transistor 18 (which is the leakage current of sensing network 16) multiplied by a width ratio B. The width ratio B is equal to the width of transistor 14 divided by the width of transistor 18.

The conductivity of the keeper transistor 12 is preferably made larger than the conductivity of current-setting transistor 14. This may be done by constructing keeper transistor 12 with a larger ratio of gate width to gate length (W/L ratio) than that of current-setting transistor 14. For example, the W/L ratio of transistor 12 may be twice or more than the W/L ratio of transistor 14.

As seen in FIG. 2, each leg of the gate's logic circuit comprises a series connection of one or more transistors and/or parallel-transistor groups. For example, the first leg has a single transistor M1,1 serially connected to a parallel-transistor group (transistors M1,2-A and M1,2-B), which is serially connected to a single transistor M1,3. The second leg has three serially-connected transistors M2,1, M2,2, and M2,3, while the N-th leg has only one transistor MN,1. In general, each leg may have a large number, which we denote as "P," of serially-connected elements, each of which has a maximum leakage current. The maximum leakage current occurs when the full voltage difference between the intermediate node and the second supply line is applied across the source and drain terminals of the transistor(s) in that element. The full voltage is applied when the gate(s) of the transistor(s) in that element is held at a logic low, while the gates of the other transistors in the leg are held at a logic high state. The element in a leg that will set the maximum leakage current in the leg can be determined by comparing the total transistor gate widths of the elements of the leg. The element having the largest total transistor gate width is expected to set the maximum leakage current for the leg.

With that explanation, it may be now seen that a sensing network 16 may be constructed by the following steps:

1. Identifying the element in each leg of the logic circuit that sets the maximum leakage current for the leg;
2. Replicating, in the sensing network, the transistor(s) of each identified element of the logic circuit;
3. Connecting the drain terminals of the replicated transistors to the first conduction terminal of the sensing network;
4. Connecting the source terminals of the replicated transistors to the second conduction terminal of the sensing network; and
5. Connecting the gate terminals of the replicated transistors to their source terminals and/or to the second conduction terminal of the sensing network to place the replicated transistors in an off state, where the maximum leakage current may be generated.

Figure 3:
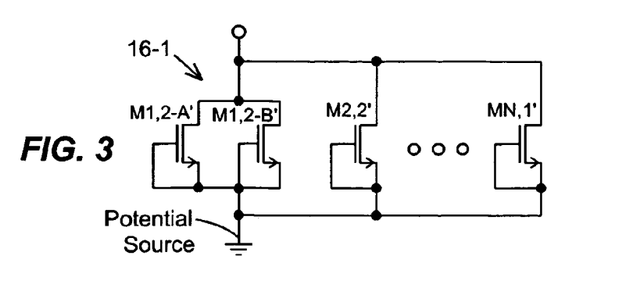
FIG. 3 illustrates a first exemplary sensing network according to the present invention.

The results of these steps, as based on the logic circuit shown in FIG. 2, are shown in FIG. 3. For the sake of illustration, and without loss of generality, it is assumed that the transistor group M1,2-A and M1,2-B comprise the element that sets the maximum leakage current of the first leg of the logic circuit, that transistor M2,2 is the element that sets the maximum leakage current of the second leg, and that transistor MN,1 sets the maximum leakage current of the N-th leg. Network 16-1 then comprises N legs that correspond to the N legs of the logic circuit shown in FIG. 2, with each leg spanning between the first and second conduction terminals of the network and comprising a replica of the transistor(s) that set the maximum leakage current through the leg. Thus, the first leg of network 16-1 has replica transistors M1,2-A' and M1,2-B' that are replicas of transistors M1,2-A and M1,2-B, respectively; the second leg of network 16-1 has a replica transistor M2,2' that is a replica of transistor M2,2; and the N-th leg of network 16-1 has a replica transistor MN,1' that is a replica of transistor MN,1. The drain terminals of the replica transistors are coupled to the first conduction terminal of the network, the gate terminals of the replica transistors are coupled to their respective source terminals, and the source terminals of the replica transistors are coupled to the second conduction terminal of the network. In this matter, network 16-1 will generate a substantially identical replica of the expected maximum leakage current that could flow through the logic circuit shown in FIG. 2 (in the case where node NI is not to be discharged during the evaluation phase).

In practice, there may be some variation between the threshold voltages of the transistors in network 16-1 and the corresponding transistors in the logic circuit, and such a variation would cause the actual maximum leakage current of the logic circuit (rather than the expected value) to be different from that generated by network 16-1. To address this possibility, the maximum current set by transistor 14 typically includes a safety margin (M) of 10% to 1000% of the expected maximum leakage current. In such a case, where network 16-1 is used, the maximum current set of transistor 14 would be between 1.1 and 10 times the leakage current generated by network 16-1. The safety margin typically ranges between 200% and 600% (2 times to 6 times). This safety margin can be implemented by setting the gate-width ratio B between transistors 14 and 18 to a value in the range of 1.1 to 2. As another approach to implement the safety margin, B may be kept at 1, and additional transistors may be added to network 16-1, or the widths of the replica transistors may be increased. The safety margin may also be achieved by combining these two approaches, (e.g., B>1 and increasing the gate widths of the transistors in network 16-1).

Most CMOS processes are well characterized by the process providers, and a process provider is usually able to provide to the circuit designer the relationship of transistor leakage current as a function of gate width for each of the fast, slow, and target NMOS transistors. (The amount of leakage current per unit of gate width generally varies with the gate width due to electric-field fringing effects at the ends of the gate.) With these relationships, it is often possible for the circuit designer to construct a sensing network having only one transistor that approximates the threshold leakage current of sensing network 16-1. This one-transistor sensing network is shown at 16-2 in FIG. 4. Network 16-2 has an NMOS transistor MEQ with a gate width that generates a leakage current that is substantially equivalent to that generated by network 16-1. For compactness, the transistor may comprise a multi-fingered gate structure, and interdigitated source and drain regions.

Figure 4:
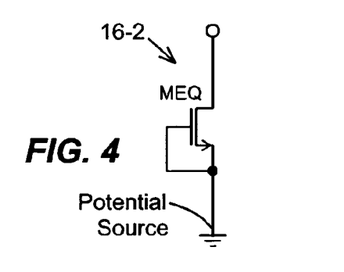
FIG. 4 illustrates a second exemplary sensing network according to the present invention.

In some cases, it may be advantageous to construct network 16-2 to generate a scaled replica (rather than a substantially identical replica) of the expected maximum leakage current of the logic circuit shown in FIG. 2, with the scaling factor typically being less than 1. Then, the width ratio B between transistors 14 and 18 may be selected so that current-setting transistor 14 provides the substantially identical replica, or the substantially identical replica plus a safety margin. For example, network 16-2 may generate a replica that is substantially equal to one-fourth of maximum leakage current of the logic circuit, and transistors 14 and 18 may be constructed with a width ratio of B=4 to provide a substantially identical replica, or a width ratio greater than 4 to provide the substantially identical replica with a safety margin.

Figure 5:
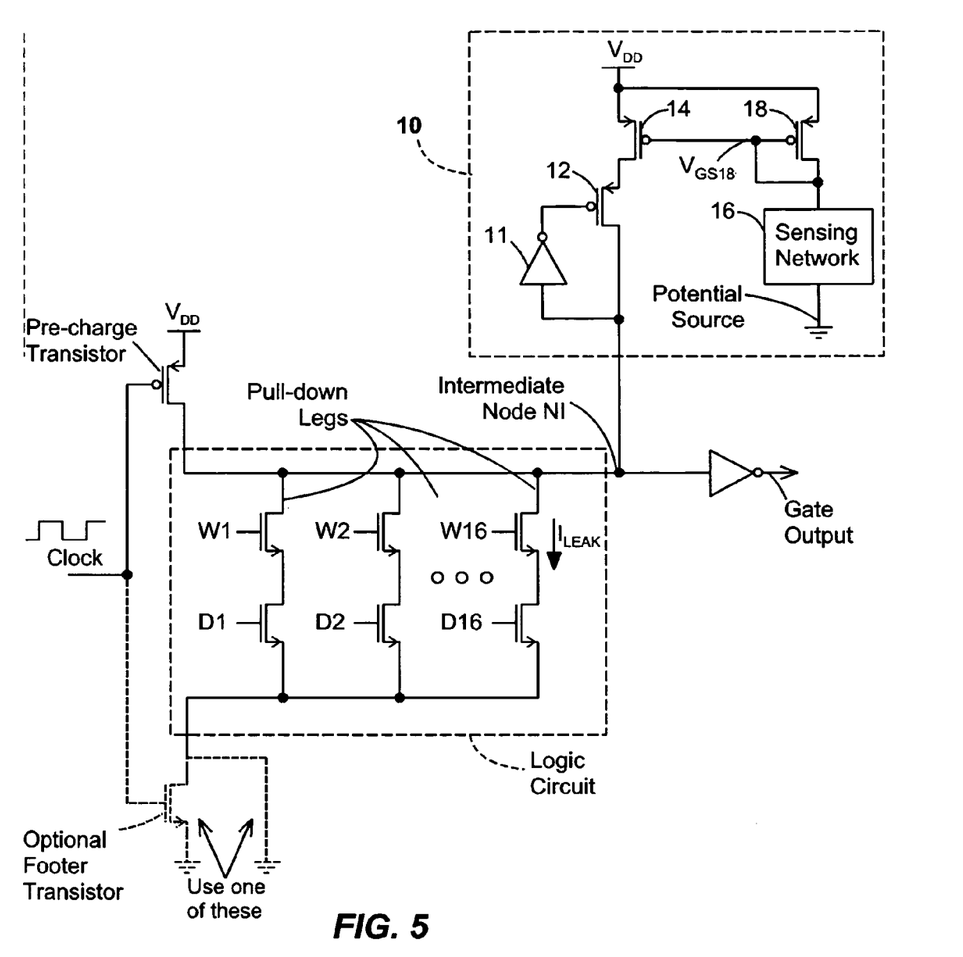
FIG. 5 shows an exemplary dynamic AND-OR-Invert gate with a keeper circuit from the first exemplary class according to the present invention.

The present invention has particular application to the AND-OR-Invert (AOI) gates used in single-side reading of memory cells. Such an AOI gate has a large number of pull-down legs, one per word line (column-side decode), with the number being equal to 16 or more. FIG. 5 shows an example of such a gate, where sixteen word lines W1, W2, ...W16 and sixteen memory-cell data lines D1, D2, ...D16 are received as inputs. The logic circuit has sixteen pull-down legs, with each leg having a top transistor and a bottom transistor. The word lines are provided as inputs to the top transistors of the sixteen legs of the logic circuit, and the data lines are provided as inputs to the bottom transistors of the legs. Keeper circuit 10 is the same as previously described.

Typically, the maximum leakage currents through the pull-down legs for the AOI gate will be substantially equal to one another, and will be either set by the top transistor or the bottom transistor, depending upon the particular gate design. Generally, the top and bottom transistors have the same construction, and that case is used here for illustration. We denote the maximum leakage current through one pull-down leg of the AOI gate's logic circuit as $I_{LEAK}$, and the number of pull-down legs (i.e., number of leakage paths) as N. The expected maximum leakage current $I_{LEAK}$ for one pull-down leg is determined as described above. The total expected maximum leakage current of all the legs would be $N \cdot I_{LEAK}$. Transistors 14, 18 are constructed so that the maximum current flowing through transistor 14 is substantially equal to $M \cdot N \cdot I_{LEAK}$, where M is a safety margin parameter that is greater than 1, and generally equal to or less than 10. The value of M is generally chosen in view of the particular construction of the gate and the degree of variation in the manufacturing process, and is based on engineering judgment of these issues. The gate length and threshold voltage of the transistors of network 16 are preferably made with the same construction as those of the transistors in the pull-down circuit so as to replicate the leakage current generation mechanism as closely as possible. The width of the transistors in sensing network 16 may be made the same as the width of the pull-down transistors, so that the leakage current ($I_{T16}$) of each transistor is substantially equal to $I_{LEAK}$. If sixteen transistors are used in network 16, then the width ratio B between transistors 14 and 18 is set equal to M. If only one transistor is used, then the width ratio B between transistors 14 and 18 is set equal to the product of M·N. As another example, the width ratio B may be set at 1 and additional transistors may be added to the network. For example, if M=2, then 32 transistors could be used. Additional configurations are possible of course, whereby the value of B, the number of transistors in network 16, and the gate widths of those transistors are varied.

Figure 6A:
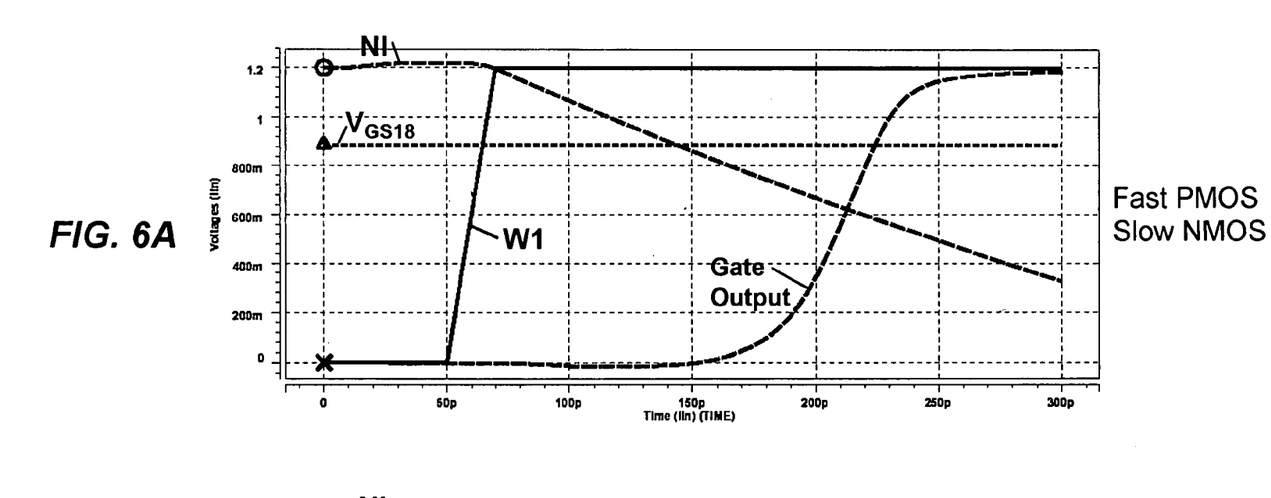
FIGS. 6A and 6B illustrate simulation results of the dynamic AND-OR-Invert gate and keeper circuit illustrated in FIG. 5 under two extreme process conditions.
Figure 6B:
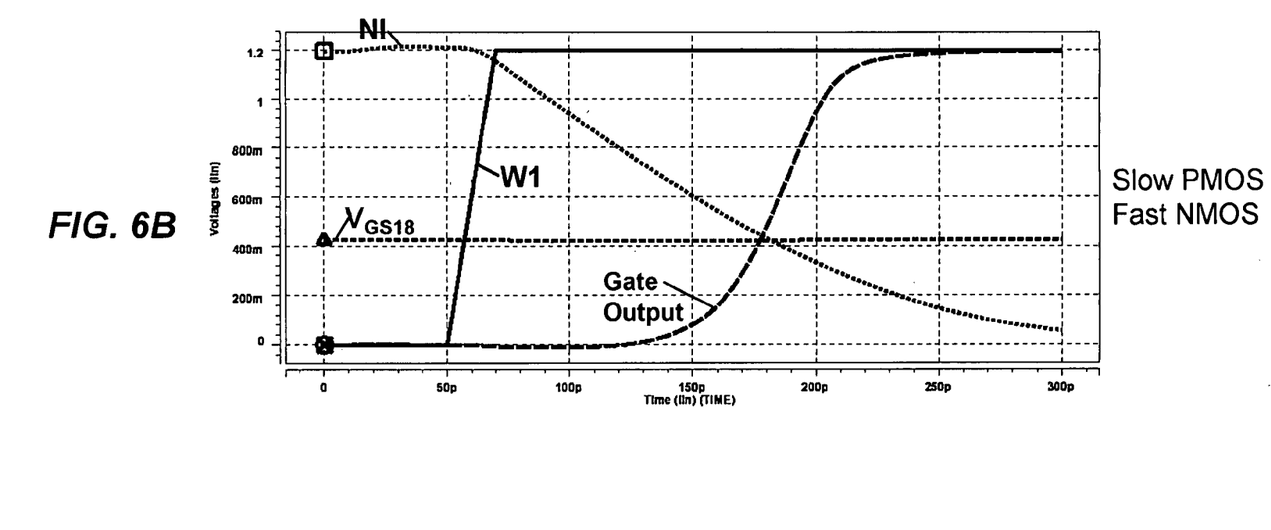

FIGS. 6A and 6B present exemplary simulation results for the circuit of FIG. 5 under the fast PMOS/slow NMOS combination (FIG. 6A) and the slow PMOS/fast NMOS combination (FIG. 6B). Each of FIGS. 6A and 6B show the progression of the following four voltages as a function of time during an evaluation phase of the gate (after the completion of the pre-charge phase): input signal "W1", intermediate node "NI", the gate-to-source voltage $V_{GS18}$ of transistor 18, and the gate output. Sixteen pull-down branches are used, three of which are illustrated in FIG. 5. During the evaluation phase, input signal "W1" is raised from a logic "0" value to a logic "1" value at the top transistor of the first leg, while inputs to the gates of the top transistors of the other fifteen (15) legs are maintained in logic "0" states (i.e., signals "W2" through "W16" are logic "0"). To maximize the leakage current in each of the pull-down legs, the input signals to the bottom-transistor gates of all the pull-down legs are set to logic "1" states (i.e., signals "D1" through "D16"). All of the NMOS transistors have gate lengths of 0.09 μm, and have either fast or slow threshold voltages in the range of standard threshold voltages (as opposed to values in the range of high threshold voltages), depending upon the transistor combination being simulated. The pull-down NMOS transistors have gate widths of 0.35 μm (W=0.35 μm), and sensing network 16 has 32 NMOS transistors with the same dimensions as the pull-down NMOS transistors. The PMOS transistors 14 and 18 (current mirror structure) have the same gate dimensions (W=0.22 μm, L=0.2 μm), and thus the width ratio B=1. The safety margin factor M equals 2. Keeper transistor 12 has gate dimensions of W=0.22 μm, L=0.09 μm, and is significantly more conductive than current-setting transistor 14.

The waveform for the input signal "W1" is the same for both transistor combinations illustrated in FIGS. 6A and 6B, with signal "W1" starting its transition at the 50 pico-second time mark. From zero pico-seconds to 50 pico-seconds, it can be seen that the voltage at intermediate node NI stays constant, indicating that keeper circuit 10 is properly maintaining the voltage of the intermediate node. Of the two transistor combinations illustrated in FIGS. 6A and 6B, the slow PMOS/fast NMOS condition (FIG. 6B) would have the most difficult time maintaining the voltage of the intermediate node NI. As can be seen in the figure, it successfully maintains the voltage during this initial time period. During the time period from 50 pico-seconds to 250 pico-seconds, intermediate node NI and the gate output undergo switching in response to the transition in input signal "W1". The worst-case delay should occur for the fast PMOS/slow NMOS transistor combination, the results of which are illustrated in FIG. 6A. As can be seen, the delay from the 50% point of signal "W1" to the 50% point of the gate output signal is 152 pico-seconds. The delay for the slow PMOS/fast NMOS transistor combination (FIG. 6B) was found to be less, and was 125 pico-seconds. By comparing FIGS. 6A and 6B, it can be seen that the value of the gate-to-source voltage $V_{GS18}$ of mirror transistor 18 is different between the two transistor combinations, showing that the voltage self-adjusts to meet the leakage current level of sensing network 16, and to account for the conductance variations in the PMOS transistors.

As a comparison, a circuit using a conventional keeper circuit (FIG. 1) was constructed. In order to achieve an operable circuit, high-threshold voltage transistors were used for the NMOS pull-down transistors, and the keeper transistor was sized to address the leakage current under the transistor combination of slow PMOS/fast NMOS. The worst-case delay should occur for the fast PMOS/slow NMOS transistor combination, and was found to be 248 pico-seconds, as compared to 152 pico-seconds when using the present invention. Thus, the present invention provides a 39% decrease in gate delay. The speed improvement resulted from at least two factors: better control of the keeper current, and the use of the standard threshold voltage devices (i.e., standard device construction with low threshold voltage) in the pull-down legs rather than high-threshold voltage devices (i.e., device construction with higher threshold voltage).

Figure 7:
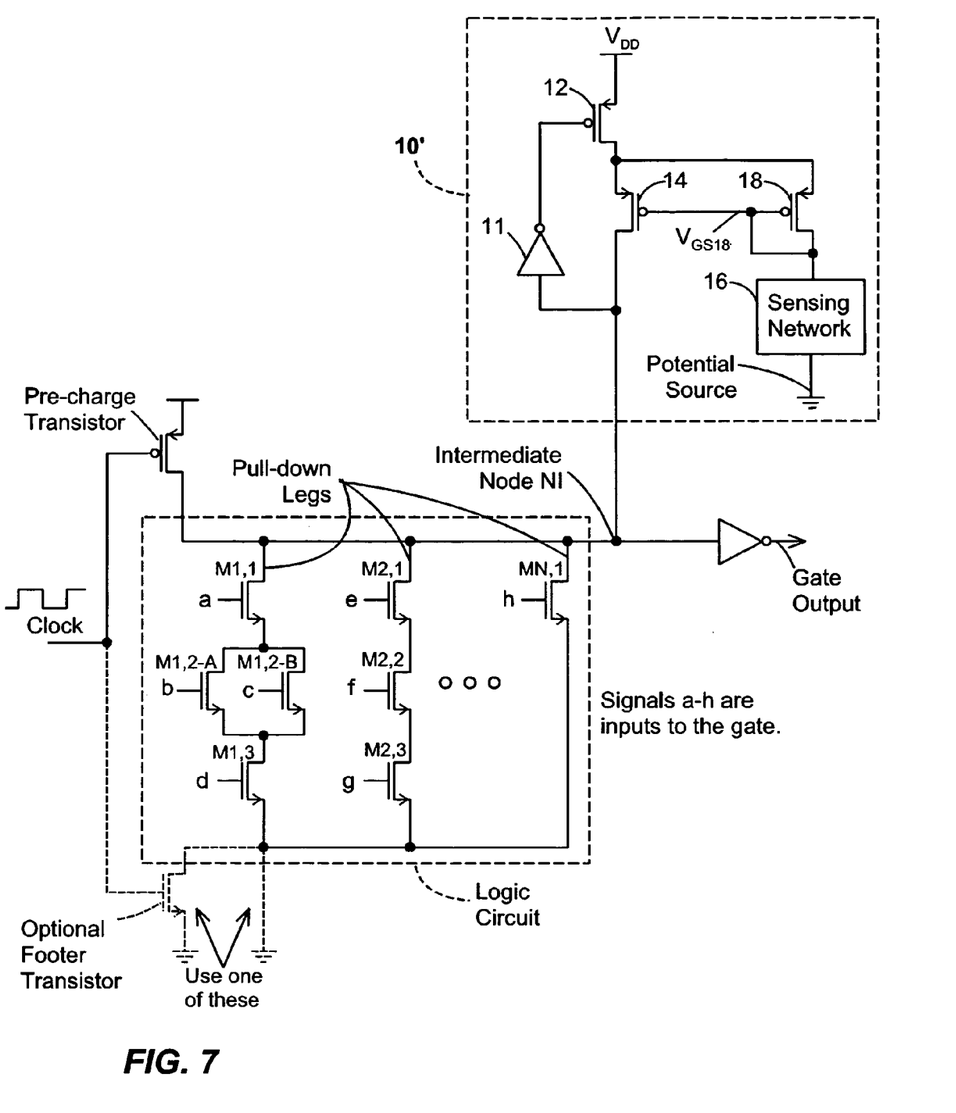
FIG. 7 illustrates a second exemplary class of keeper circuits according to the present invention as applied to a representative digital dynamic gate.

A second exemplary embodiment of a keeper circuit according to the present invention is shown at 10' in FIG. 7. Keeper circuit 10' has the same components as keeper circuit 10 shown in FIG. 2, and has the same interconnections except that the positions of transistors 12 and 14 have been exchanged. The operation of keeper circuit 10' is substantially the same as that of keeper circuit 10'.

Figure 8:
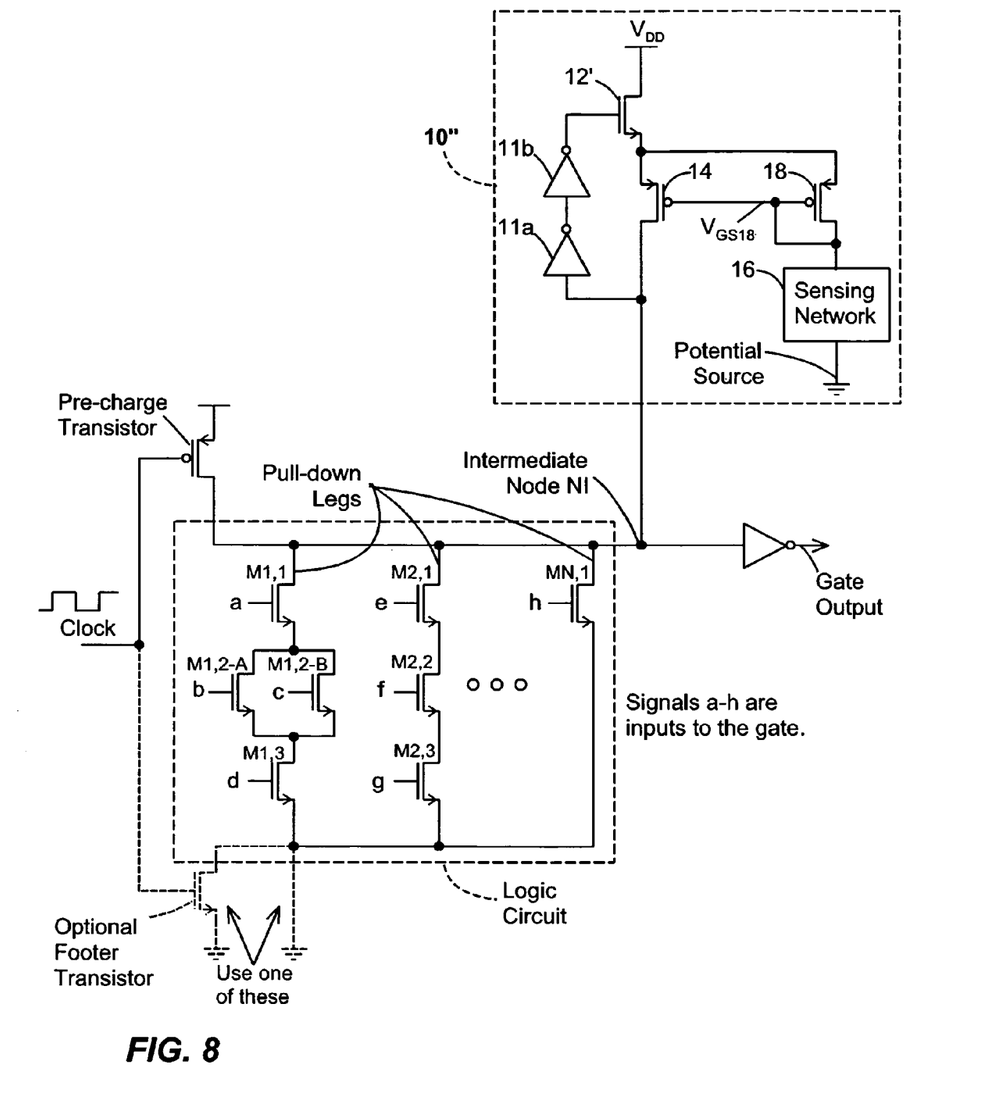
FIG. 8 illustrates a third exemplary class of keeper circuits according to the present invention as applied to a representative digital dynamic gate.

While it is currently preferred to use a PMOS device for keeper transistor 12, it is possible to use an NMOS keeper transistor. A third exemplary embodiment using an NMOS keeper transistor is shown at 10" in FIG. 8. The keeper 10" uses an NMOS keeper transistor 12' in place of PMOS keeper transistor 12 of keeper circuit 10 (FIG. 2). The NMOS keeper transistor 12' is only able to charge the intermediate node to a voltage level equal to the $V_{DD}$ supply line minus the threshold voltage of the device. For that reason, keeper circuit 10" is currently less preferred than the previously described keeper circuits.

Figure 9:
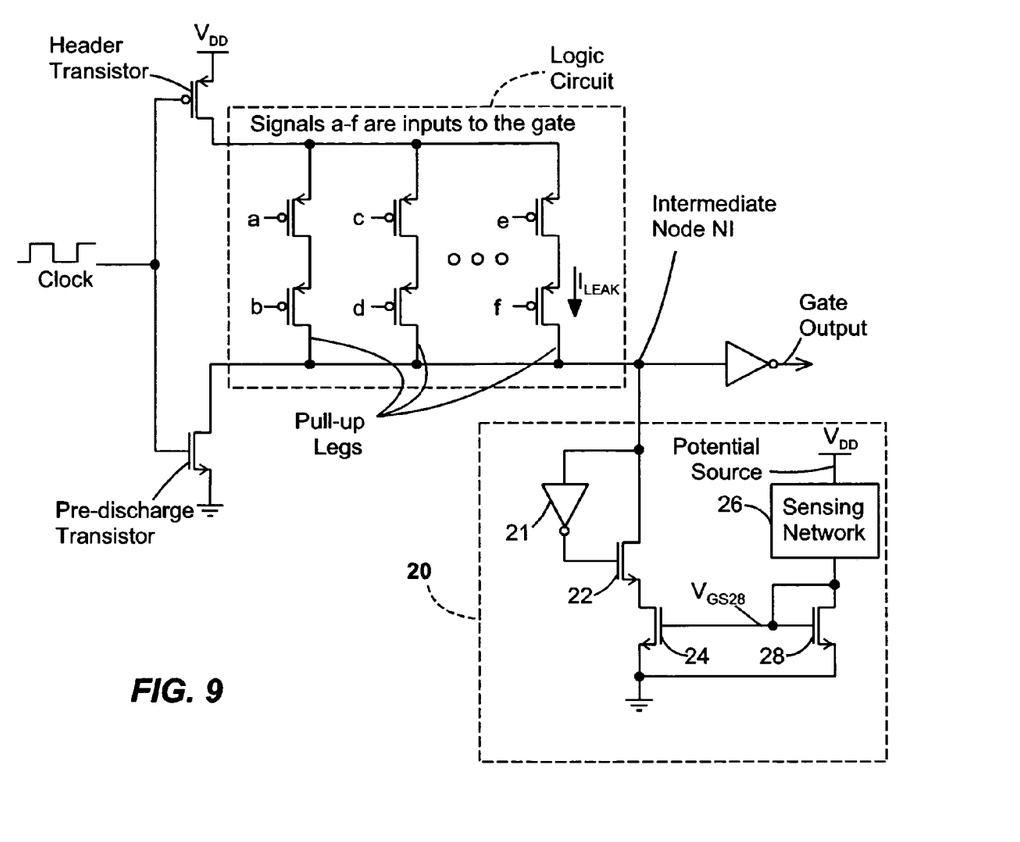
FIG. 9 illustrates a fourth exemplary class of keeper circuits according to the present invention as applied to a representative digital dynamic gate.

While it is currently preferred to use an NMOS pull-down logic circuit in dynamic logic gates to achieve fast operation speeds, it is possible to use a PMOS pull-up logic circuit in a dynamic gate. In such a gate, the intermediate node is discharged during an initial phase of a clock signal, and thereafter selectively charged by one or more PMOS pull-up legs of a pull-up logic circuit. The pull-up dynamic gate is the circuit complement of the dynamic gate illustrated in FIG. 2 or in FIG. 5. An exemplary pull-up dynamic AOI gate is illustrated in FIG. 9, along with an exemplary keeper circuit 20 according to the present invention that may be used with the pull-up keeper gate. Keeper circuit 20 is the circuit complement of keeper circuit 10, which is obtained by replacing the NMOS transistors of keeper circuit 10 with PMOS transistors, replacing the PMOS transistors of keeper circuit 10 with NMOS transistors, and exchanging the voltages on the supply lines (i.e., exchanging $V_{DD}$ and ground).

More specifically, keeper circuit 20 comprises an NMOS keeper transistor 22 driven by an inverter 21, an NMOS current-setting transistor 24, a sensing network 26 comprising one or more PMOS transistors, and an NMOS controlling mirror transistor 28. Current-setting transistor 24 and keeper transistor 22 are coupled in a series circuit (e.g., drain terminal of transistor 24 is coupled to source terminal of transistor 22), and the series circuit is coupled between the ground supply line and the intermediate node NI. The gate of keeper transistor 22 is driven by the output of inverter 21, and the input of inverter 21 is coupled to intermediate node NI. Sensing network 26 is of the same type as the pull-up transistors in the gate's logic circuit (PMOS in this case), and is located on the same die as the pull-up transistors. Sensing network 26 is configured to replicate, and thereby sense, the leakage current of the pull-up transistors. This can be done in manners similar to those described above for keeper circuit 10.

The amount of leakage current generated by sensing network 26 is measured by controlling mirror transistor 28, which has its drain and gate terminals coupled to the bottom conduction terminal of sensing network 26 to receive the leakage current of network 26. Transistors 24 and 28 are configured in a current mirror topology whereby the current flowing through controlling mirror transistor 28 is replicated and scaled by a selectable amount in transistor 24. In this configuration, current-setting transistor 24 also acts as a controlled mirror transistor. During operation, the gate-to-source voltage of transistor 28 adjusts itself so that the current flow through the device matches the leakage current flowing through sensing network 26. This gate-to-source voltage is replicated onto current-setting transistor 24 by coupling the gate terminal of transistor 28 to the gate terminal of transistor 24, by coupling the source terminal of transistor 28 to the source terminal of transistor 24, and by making the construction features of transistors 24 and 28 substantially the same, with the possible exception of the gate widths. With this configuration, the maximum current through current-setting transistor 24 is substantially set to the level of current flowing through transistor 28 (which is the leakage current of sensing network 26) multiplied by a width ratio B. The width ratio B is equal to the width of transistor 24 divided by the width of transistor 28.

Thus, it can be seen that transistors 22, 24, and 28 of circuit 20 operate in a similar manner as transistors 12, 14, and 18 of circuit 10, except that they are configured as the circuit complement of keeper circuit 10.

While the pull-up logic circuit shown in FIG. 9 is slower than the pull-down logic circuit shown in FIG. 2, it can be advantageous to use it in certain circumstances where the gate is to receive active-low input signals rather than active-high input signals. In other words, it may have logic advantages over the pull-up logic circuit.

As described above, there were several variations of keeper circuit 10, some of which were illustrated by keeper circuits 10' and 10". Likewise, complementary keeper circuit 20 may have the same variations.

In keeper circuits 10 and 20, the gate-to-source voltage of the controlling mirror transistors 18 and 28 was used to set the voltage on a respective current-setting transistor (14 or 24). It may be appreciated that the voltage generated by the controlling mirror transistor may be supplied to the current-setting transistors of other instances of the keeper circuit, thereby eliminating the need to replicate the sensing networks (16 and 26) and the controlling mirror transistors (18 and 28) for these other instances of the keeper circuit. In other words, if several keeper circuits are disposed in close proximity to one another on a substrate, then one set of sensing network (16 or 26) and controlling mirror transistor (18 or 28) may be shared among the keeper circuits. While the sensing network would be designed to generate one level of leakage current, that level can be scaled to an appropriate level for each gate by selecting the gate width of the current-setting transistor for the gate (the selection of gate width and ratio B were described above). The sharing reduces the space (i.e., overhead) needed to implement the keeper circuit according to the present invention to two transistors and one sensing network for the first gate, and one additional transistor for each additional gate. This sharing is particularly useful in register files and multi-port SRAMs where the bit lines have the same addressing structure. The overhead for implementing the present invention for even a fairly small RAM is negligible, being well below 1% of an increase in space.

While the exemplary keeper circuits according to the present invention were illustrated with dynamic gates of the AND-OR-Invert type, the present invention may be applied to any gate structure, including dynamic OR gates, which are frequently used in second-level sensing when local and global bit-lines are used.

While the present invention has been illustrated with transistors 14 and 18 (and transistors 24 and 28) in a conventional current-mirror arrangement, it may be appreciated that the present invention may be practiced with these transistors configured according to other known current-mirror arrangements, such as the Widlar current-mirror arrangement and the Wilson current-mirror arrangement. In the latter case, the drain and gate terminals of transistor 18 are coupled to one another through a transistor which is coupled in series with transistor 14. In all of the current-mirror arrangements, transistor 18 (or 28) is coupled to transistor 14 (or 24) in a current-mirroring relationship such that the maximum amount of current conducted by transistor 14 (or 24) through its conduction terminals is related to the current conducted by transistor 18 (or 28) through its conduction terminals.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A keeper circuit for use in a circuit powered by a voltage provided between a first supply line and a second supply line, the keeper circuit for selectively maintaining an intermediate node of the circuit at a first voltage level in opposition to a leakage current being conducted between the intermediate node and the second supply line, the keeper circuit comprising:

a keeper transistor having a first conduction terminal, a second conduction terminal, and a modulation terminal, the modulation terminal receiving a signal indicating whether the keeper transistor is to maintain an intermediate node at a first voltage level;

a first transistor of a first conductivity type having a first conduction terminal, a second conduction terminal, and a modulation terminal, one of the conduction terminals of the first transistor being coupled to a conduction terminal of the keeper transistor to provide a series circuit of the transistors, the series circuit being coupled between the intermediate node and the first supply line;

a second transistor of the first conductivity type having a first conduction terminal, a second conduction terminal, and a modulation terminal, the second transistor being coupled to the first transistor in a current-mirror relationship such that the maximum amount of current conducted by the first transistor through its conduction terminals is related to the current conducted by the second transistor through its conduction terminals; and a sensing network having a first conduction terminal coupled to the first conduction terminal of the second transistor and a second conduction terminal coupled to a source of potential, the sensing network comprising at least one transistor of a second conductivity type opposite to the first conductivity type and generating a current at its first conduction terminal that is in relation to the leakage current being conducted between the intermediate node and the second supply line.

2. The keeper circuit of claim 1 wherein the keeper transistor is coupled to the intermediate node and the first transistor is coupled to the first supply line.

3. The keeper circuit of claim 1 wherein the first transistor is coupled to the intermediate node and the keeper transistor is coupled to the first supply line.

4. The keeper circuit of claim 1 wherein the modulation terminal of the keeper transistor receives a signal related to the voltage state of the intermediate node.

5. The keeper circuit of claim 1 wherein the keeper transistor has a W/L ratio that is larger than the W/L ratio of the first transistor.

6. The keeper circuit of claim 1 wherein the modulation terminal and the second conduction terminal of the second transistor are coupled together, and wherein the modulation terminal of the second transistor is coupled to the modulation terminal of the first transistor, and wherein the second conduction terminal of the second transistor is coupled to the second conduction terminal of the first transistor.

7. The keeper circuit of claim 1 wherein the sensing network comprises a PMOS transistor, and wherein each of the first and second transistors comprises a respective NMOS transistor.

8. The keeper circuit of claim 1 wherein the sensing network comprises an NMOS transistor, and wherein each of the first and second transistors comprises a respective PMOS transistor.

9. The keeper circuit of claim 1 wherein the at least one transistor of the sensing network has a first conduction terminal, a second conduction terminal, and a modulation terminal, wherein the modulation terminal and second conduction terminal are coupled together, and wherein the first conduction terminal is coupled to the first conduction terminal of the second transistor.

10. The keeper circuit of claim 1 wherein the at least one transistor of the sensing network has a first conduction terminal, a second conduction terminal, and a modulation terminal, wherein the modulation terminal and second conduction terminal are coupled to the second supply line, and wherein the first conduction terminal is coupled to the first conduction terminal of the second transistor.

11. The keeper circuit of claim 1 wherein a plurality of N legs of a logic circuit are coupled to the intermediate node, each leg having at least one transistor;
wherein the keeper circuit and the legs of the logic circuit are disposed on a common substrate.

12. The keeper circuit of claim 11 wherein the sensing network and at least one of the transistors of the logic circuit are disposed in a common substrate well.

13. The keeper circuit of claim 1 wherein a plurality of N legs of a logic circuit are coupled to the intermediate node, each leg having at least one transistor;
wherein the keeper circuit and the legs of the logic circuit are disposed on a common substrate that has transistors of the second conductivity type integrated thereon, with a first group of such transistors having a first construction to provide a low range of threshold voltages and a second group of such transistors having a second construction to provide a high range of threshold voltages; and
wherein at least one transistor of the logic circuit comprises a transistor having the first construction.

14. The keeper circuit of claim 1 wherein a plurality of legs of a logic circuit are coupled to the intermediate node, each such leg comprising one or more serially-connected elements, each such element comprising a single transistor or a group of parallel-connected transistors;
wherein each leg has an expected maximum leakage current equal to the expected leakage current of the element of the leg having the largest collective amount of transistor gate width;
wherein the logic circuit has an expected maximum leakage current equal to the sum of the expected maximum leakage currents of the legs; and
wherein the maximum current of the first transistor is between 1.1 times and 10 times the expected maximum leakage current of the logic circuit.

15. The keeper circuit of claim 14 wherein the maximum current of the first transistor is between 2 times and 6 times the expected maximum leakage current of the logic circuit.

16. A keeper circuit for use in a digital circuit powered by a voltage provided between a first supply line and a second supply line, the keeper circuit for selectively maintaining an intermediate node of the digital circuit at a first voltage level, the keeper circuit comprising:
a keeper transistor having a first conduction terminal, a second conduction terminal, and a modulation terminal, the modulation terminal receiving a signal indicating whether the keeper transistor is to maintain an intermediate node at a first voltage level;
a first PMOS transistor having a drain terminal, a source terminal, and a gate terminal, one of the source and drain terminals of the first PMOS transistor being coupled to a conduction terminal of the keeper transistor to provide a series circuit of the transistors, the series circuit being coupled between the intermediate node and the first supply line;
a second PMOS transistor having a drain terminal, a source terminal, and a gate terminal, the second PMOS transistor being coupled to the first PMOS transistor in a current-mirror relationship such that the maximum amount of current conducted by the first PMOS transistor through its drain and source terminals is related to the current conducted by the second PMOS transistor through its source and drain terminals; and
at least a first NMOS transistor having a drain terminal coupled to the drain terminal of the second PMOS transistor, a source terminal, and a gate terminal, wherein the gate terminal and the source terminal are coupled together and to a source of potential.

17. The keeper circuit of claim 16 wherein the keeper transistor is coupled to the intermediate node and the first PMOS transistor is coupled to the first supply line.

18. The keeper circuit of claim 16 wherein the first PMOS transistor is coupled to the intermediate node and the keeper transistor is coupled to the first supply line.

19. The keeper circuit of claim 16 wherein the modulation terminal of the keeper transistor receives a signal related to the voltage state of the intermediate node.

20. The keeper circuit of claim 16 wherein the keeper transistor has a W/L ratio that is larger than the W/L ratio of the first PMOS transistor.

21. The keeper circuit of claim 16 wherein the gate terminal and the drain terminal of the second PMOS transistor are coupled together, and wherein the gate terminal of the second PMOS transistor is coupled to the gate terminal of the first PMOS transistor, and wherein the source terminal of the second PMOS transistor is coupled to the source terminal of the first PMOS transistor.

22. The keeper circuit of claim 16 wherein the gate and source terminals of the at least first NMOS transistor are coupled to the second supply line.

23. The keeper circuit of claim 16 wherein a plurality of N legs of a logic circuit are coupled to the intermediate node, each leg having at least one transistor;
wherein the keeper circuit and the legs of the logic circuit are disposed on a common substrate.

24. The keeper circuit of claim 16 wherein a plurality of N legs of a logic circuit are coupled to the intermediate node, each leg having at least one transistor;
wherein the keeper circuit and the legs of the logic circuit are disposed on a common substrate that has NMOS transistors integrated thereon, with a first group of such NMOS transistors having a first construction to provide a low range of threshold voltages and a second group of such NMOS transistors having a second construction to provide a high range of threshold voltages; and
wherein at least one transistor of the logic circuit comprises an NMOS transistor having the first construction.

25. The keeper circuit of claim 16 wherein a plurality of legs of a logic circuit are coupled to the intermediate node, each such leg comprising one or more serially-connected elements, each such element comprising a single transistor or a group of parallel-connected transistors;
wherein each leg has an expected maximum leakage current equal to the expected leakage current of the element of the leg having the largest collective amount of transistor gate width;
wherein the logic circuit has an expected maximum leakage current equal to the sum of the expected maximum leakage currents of the legs; and
wherein the maximum current of the first PMOS transistor is between 1.1 times and 10 times the expected maximum leakage current of the logic circuit.

26. The keeper circuit of claim 25 wherein the maximum current of the first PMOS transistor is between 2 times and 6 times the expected maximum leakage current of the logic circuit.

27. A keeper circuit for use in a circuit powered by a voltage provided between a first supply line and a second supply line, the keeper circuit for selectively maintaining an intermediate node of the circuit at a first voltage level in opposition to a leakage current being conducted between the intermediate node and the second supply line, the keeper circuit comprising:
a keeper transistor having a first conduction terminal, a second conduction terminal, and a modulation terminal, the modulation terminal receiving a signal indicating whether the keeper transistor is to maintain an intermediate node at a first voltage level;
characterized by a current-setting transistor having a first conduction terminal, a second conduction terminal, and a modulation terminal, the current-setting transistor being configured to set the maximum current flow between its first and second conduction terminals in relation to the leakage current being conducted between the intermediate node and the second supply line; and
characterized in that a conduction terminal of the keeper transistor is coupled to a conduction terminal of the current-setting transistor to provide a series circuit of the transistors, and in that the series circuit is coupled between the intermediate node and the first supply line.

28. The keeper circuit of claim 27 further characterized in that the current-setting transistor comprises a transistor of a first conductivity type, and further characterized by:
a mirror transistor of the first conductivity type having a first conduction terminal, a second conduction terminal, and a modulation terminal, the mirror transistor being coupled to the current-setting transistor in a current-mirror relationship such that the maximum amount of current conducted by the current-setting transistor through its conduction terminals is related to the current conducted by the mirror transistor through its conduction terminals; and
a sensing network having one or more transistors of a second conductivity type opposite to the first conductivity type, each such transistor having a first conduction terminal coupled to the first conduction terminal of the mirror transistor, a second conduction terminal, and a modulation terminal, the modulation and second conduction terminals of the one or more transistors of the sensing network being configured with at least one source of potential to generate a collective leakage current that is in relation to the leakage current being conducted between the intermediate node and at least one of the supply lines.

29. The keeper circuit of claim 28 wherein the current-setting transistor is of the first conductivity type, wherein the modulation terminal and the second conduction terminal of the mirror transistor are coupled together, and wherein the modulation terminal of the mirror transistor is coupled to the modulation terminal of the current-setting transistor, and wherein the second conduction terminal of the mirror transistor is coupled to the second conduction terminal of the current-setting transistor.

30. The keeper circuit of claim 27 wherein a plurality of N legs of a logic circuit are coupled to the intermediate node, each leg having at least one transistor;
wherein the keeper circuit and the legs of the logic circuit are disposed on a common substrate that has transistors of a conductivity type integrated thereon with a first group of such transistors having a first construction to provide a low range of threshold voltages and a second group of such transistors having a second construction to provide a high range of threshold voltages; and
wherein at least one transistor of the logic circuit comprises a transistor having the first construction.

31. The keeper circuit of claim 27 wherein a plurality of legs of a logic circuit are coupled to the intermediate node, each such leg comprising one or more serially-connected elements, each such element comprising a single transistor or a group of parallel-connected transistors;
wherein each leg has an expected maximum leakage current equal to the expected leakage current of the element of the leg having the largest collective amount of transistor gate width;
wherein the logic circuit has an expected maximum leakage current equal to the sum of the expected maximum leakage currents of the legs; and wherein the maximum current of the current-setting transistor is between 1.1 times and 10 times the expected maximum leakage current of the logic circuit.

32. The keeper circuit of claim 31 wherein the maximum current of the current-setting transistor is between 2 times and 6 times the expected maximum leakage current of the logic circuit.

33. The keeper circuit of claim 27 wherein each of the keeper transistor and the current-setting transistor has a conductance between its first and second conduction terminals, and wherein the conductance of the keeper transistor is greater than the conductance of the current-setting transistor.

34. The keeper circuit of claim 27 wherein the modulation terminal of the keeper transistor is driven by the output of an inverter.

35. The keeper circuit of claim 27 wherein the modulation terminal of the current-setting transistor is coupled to a circuit node that is different from the circuit nodes coupled to conduction terminals of the current-setting transistor.

36. The keeper circuit of claim 27 wherein the keeper transistor has a W/L ratio that is larger than the W/L ratio of the current-setting transistor.

37. A keeper circuit for use in a circuit powered by a voltage provided between a first supply line and a second supply line, the keeper circuit for selectively maintaining an intermediate node of the circuit at a first voltage level in opposition to a leakage current being conducted between the intermediate node and the second supply line, the keeper circuit comprising:

a keeper transistor having a first conduction terminal, a second conduction terminal, and a modulation terminal, the modulation terminal receiving a signal indicating whether the keeper transistor is to maintain an intermediate node at a first voltage level;

a sensing network having one or more transistors configured to generate a leakage current that is in relation to the leakage current being conducted between the intermediate node and at least one of the supply lines; and a current-setting transistor having a first conduction terminal, a second conduction terminal, and a modulation terminal, the current-setting transistor being configured to set the maximum current flow between its first and second conduction terminals in relation to the leakage current generated by the sensing network; and wherein a conduction terminal of the keeper transistor is coupled to a conduction terminal of the current-setting transistor to provide a series circuit of the transistors, and wherein the series circuit is coupled between the intermediate node and the first supply line.

* * * * *